United States Patent
Sone et al.

(10) Patent No.: US 8,697,809 B2
(45) Date of Patent: Apr. 15, 2014

(54) BLOCK POLYMER

(75) Inventors: Takeyuki Sone, Tokyo (JP); Otto Albrecht, Atsugi (JP); Koji Yano, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 421 days.

(21) Appl. No.: 12/744,211

(22) PCT Filed: Dec. 19, 2008

(86) PCT No.: PCT/JP2008/073889
§ 371 (c)(1),
(2), (4) Date: May 21, 2010

(87) PCT Pub. No.: WO2009/090852
PCT Pub. Date: Jul. 23, 2009

(65) Prior Publication Data
US 2010/0286336 A1 Nov. 11, 2010

(30) Foreign Application Priority Data
Jan. 16, 2008 (JP) .................. 2008-006930

(51) Int. Cl.
*C08F 297/00* (2006.01)
*H01L 51/00* (2006.01)

(52) U.S. Cl.
USPC ........... 525/275; 525/242; 525/276; 525/279; 525/280; 525/298

(58) Field of Classification Search
USPC ......... 525/242, 275, 276, 279, 280, 289, 297, 525/298, 299; 588/306, 309, 317; 204/194, 204/279, 280
See application file for complete search history.

(56) References Cited

U.S. PATENT DOCUMENTS 6,291,606 B1 * 9/2001 Tang et al. ............... 526/93
7,105,374 B1 9/2006 Leonard et al.

FOREIGN PATENT DOCUMENTS

| JP | 2004-027182 A | 1/2004 |
| JP | 2004-051684 A | 2/2004 |
| JP | 2004-115628 A | 4/2004 |

OTHER PUBLICATIONS

Krebs, Frederik C. et al Polymer Bulletin vol. 50 (2003) pp. 359-366.*
Misumi, Yoshihiko et al Macromolecules vol. 31 (1998) pp. 7572-7573.*
Lee, C. et al Optical Materials vol. 21 pp. 337-341 published Jan. 2003.*
Isomura et al., "Living polymerization and block copolymerization of various ring-substituted phenylacetylenes by rhodium-based ternary catalyst," Polymer Bulletin, vol. 45, pp. 335-339 (2000).
Japanese Office Action issued in counterpart application No. 2008-006930 dated May 28, 2013, along with its English-language translation—6 pages.

* cited by examiner

*Primary Examiner* — Irina S Zemel
*Assistant Examiner* — Jeffrey Lenihan
(74) *Attorney, Agent, or Firm* — Fitzpatrick, Cella, Harper & Scinto (57) ABSTRACT

The invention provides a novel block polymer applicable to a light-emitting device. The block polymer has an electron-transporting block and a hole-transporting block, wherein the main chain backbone of the block polymer is polyacetylene.

3 Claims, 6 Drawing Sheets

BLOCK POLYMER

TECHNICAL FIELD

The present invention relates a novel block polymer. The novel block polymer according to the present invention can be applied to a light-emitting layer of a light-emitting device, and a transistor.

BACKGROUND ART

At present, attention is paid to organic electronic devices, such as transistors and light-emitting devices using an organic material. The organic electronic device has a merit of permitting the device itself to be bent. Among others, an electronic device using a conjugated polymer can be fabricated from a solution and thus can be fabricated at low cost. In addition, the device has a merit of permitting its area to be easily enlarged.

The conjugated polymer permits of realizing highly integrated devices such as monomolecular devices and molecular electronic devices.

An organic electronic device is generally comprised of a layer device structure with several functional layers stacked on one another, which layers have their respective functions such as electron transport and hole transport. In such a device structure, the functional layers can be freely combined, whereas a problem arises on injection of electrons or holes due to presence of an interface between layers.

Molecular electronic devices are expected to be applied to memories and sensors. However, it is difficult to achieve electric contact between an electrode and a molecule, and it is considered that long-term fundamental researches are required of realization thereof.

Under such circumstances, substituted helical polyacetylene has been proposed as a molecular electronic material of a conjugated system, which is expected to solve the above problems. The substituted helical polyacetylene is disclosed in Japanese Patent Application Laid-Open No. 2004-115628 and Japanese Patent Application Laid-Open No. 2004-027182. Polyacetylene having a pseudo-hexagonal structure and a super-helical conjugated structure due to π electrons based on a double bond is disclosed in Japanese Patent Application Laid-Open No. 2004-115628, and a polymer, which is a substituted polyacetylene having a helical structure, in which the density of the helical structure is reversibly changed by application of stimulus, and absorption/emission spectral characteristics are reversibly changed, is disclosed in Japanese Patent Application Laid-Open No. 2004-027182.

However, the substituted polyacetylene disclosed in Japanese Patent Application Laid-Open No. 2004-115628 and Japanese Patent Application Laid-Open No. 2004-027182 exhibits conductivity, but is not satisfactory for practical uses.

DISCLOSURE OF THE INVENTION

An extensive investigation has been carried out repeatedly in view of the above problems, whereby leading to an invention of a block polymer applicable to light-emitting devices.

The present invention thus provides a block polymer having an electron-transporting block (A) and a hole-transporting block (B).

The present invention also provides a block polymer having a luminescent block between the electron-transporting block (A) and the hole-transporting block (B).

According to the present invention, novel block polymers applicable to light-emitting layers of light-emitting devices can be provided, and development of novel devices becomes feasible.

Further features of the present invention will become apparent from the following description of exemplary embodiments with reference to the attached drawings.

BEST MODES FOR CARRYING OUT THE INVENTION

Outline of the Invention

The outline of the present invention is described with reference to FIG. 1

Figure 1:
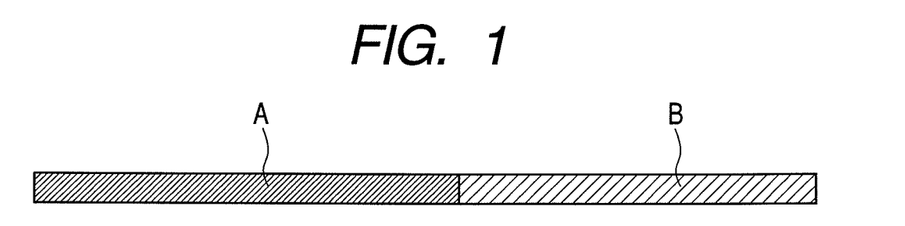
FIG. 1 illustrates an embodiment of the present invention.
Figure 2:
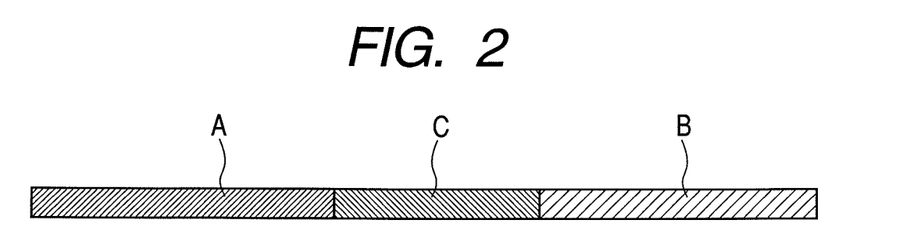
FIG. 2 illustrates another embodiment of the present invention.

FIG. 1 illustrates a block polymer according to the present invention. As illustrated in FIG. 1, the block polymer has a block A described as 'A' and a block B described as 'B'. In the present invention, the block B becomes a hole-transporting block when the block A is an electron-transporting block. When the block A exhibits N-type conductivity of semiconductors, the block B exhibits P-type conductivity. As illustrated in FIG. 2, the block polymer may be so formed that a block C is sandwiched between the black A and the block B. In this case, the block C is a luminescent block or a block exhibiting I-type conductivity.

(Backbone of Block Polymer)

The backbone of the block polymer is a carbon chain, and it is possible to provide a block polymer having functionality as illustrated in FIG. 1 by using the function of a side chain thereof. In particular, a polyacetylene backbone that is a carbon chain of a conjugated system is favorable. The functionality is imparted by varying a side chain. In other words, the backbone becomes a continuous polymer chain, whereby a block polymer having an electron-transporting block and a hole-transporting block can be provided, which means that one having no interface can be provided. Such a construction has an advantage that the transport of an electron or a hole is efficiently conducted.

Figure 3:
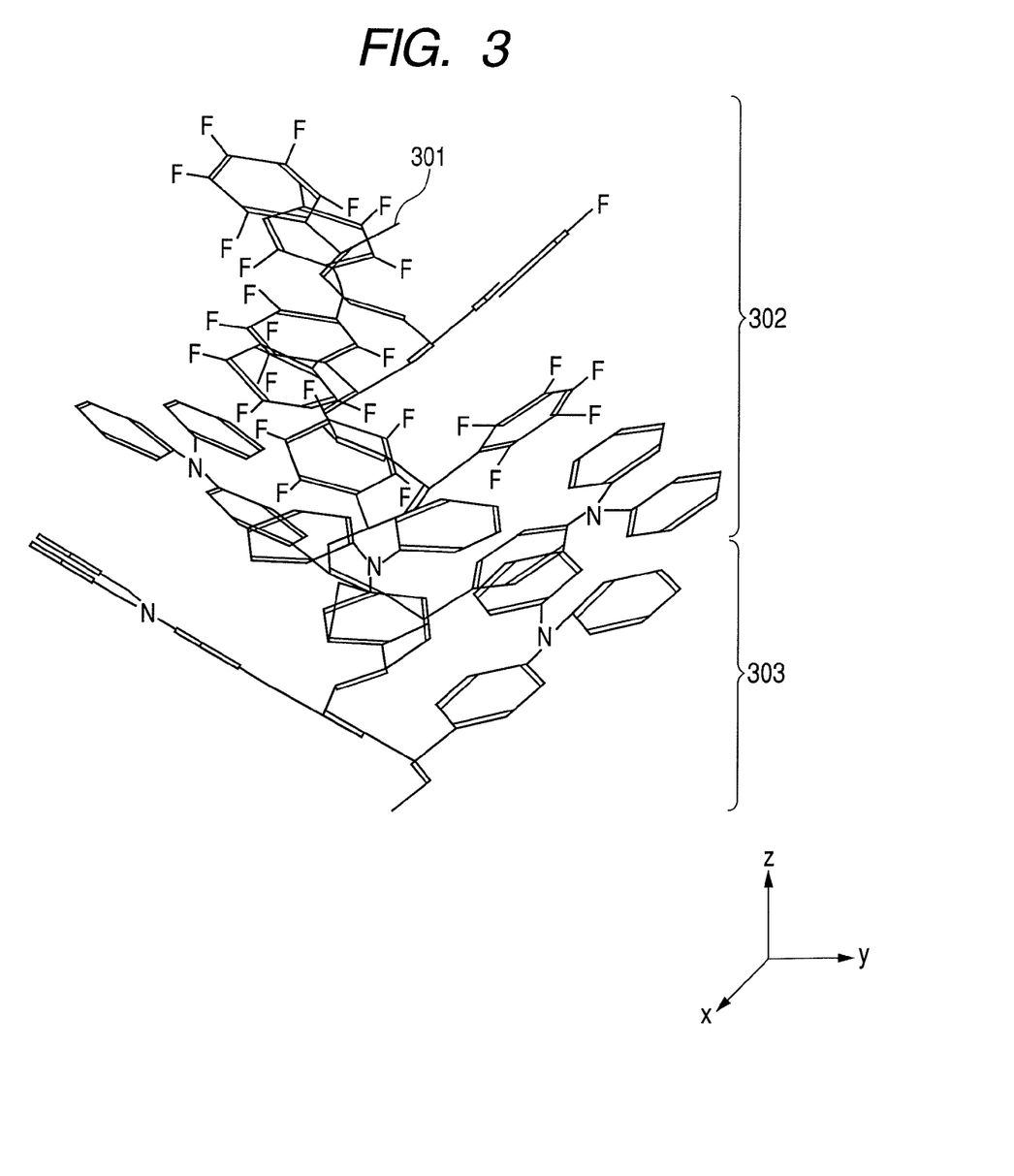
FIG. 3 illustrates the molecular structure of polyacetylene according to an embodiment of the present invention.
Figure 4:
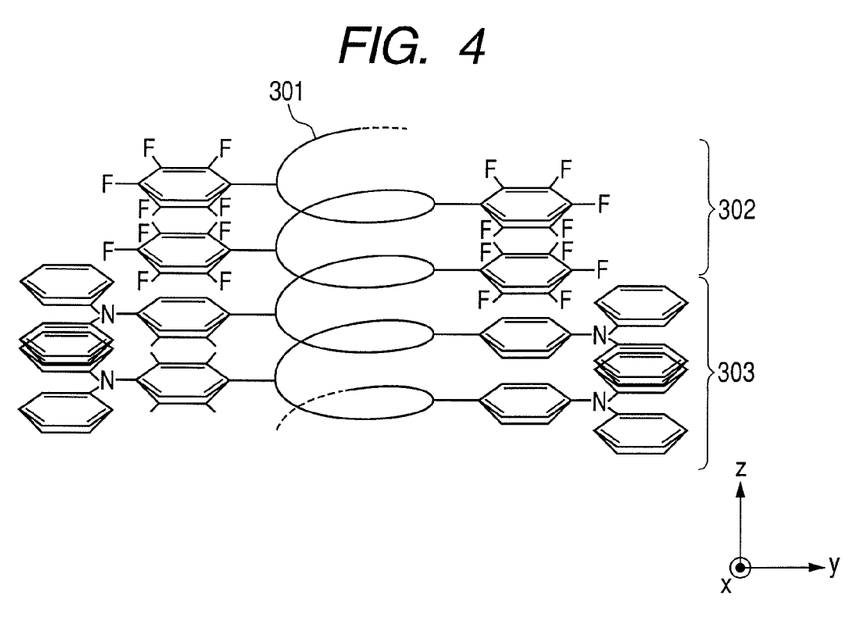
FIG. 4 illustrates the molecular structure of polyacetylene according to the embodiment of the present invention.
Figure 5:
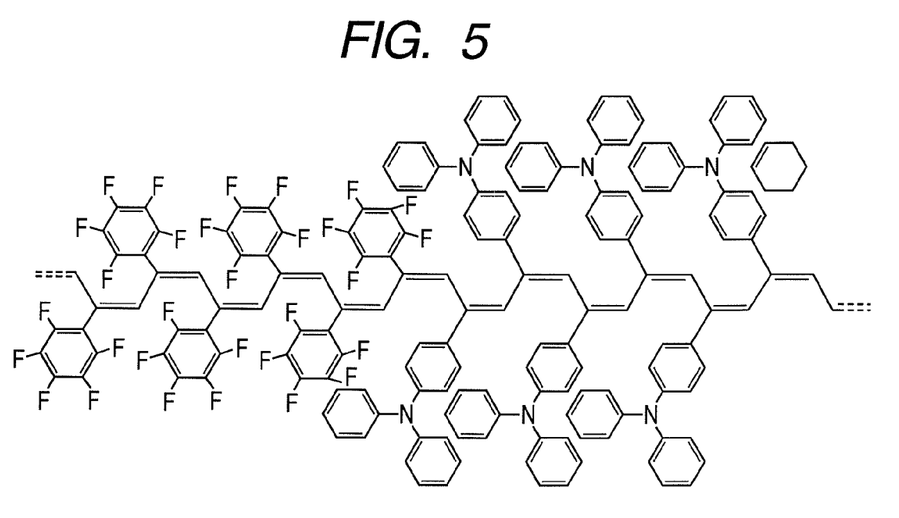
FIG. 5 illustrates the molecular structure of polyacetylene according to the embodiment of the present invention.
Figure 6:
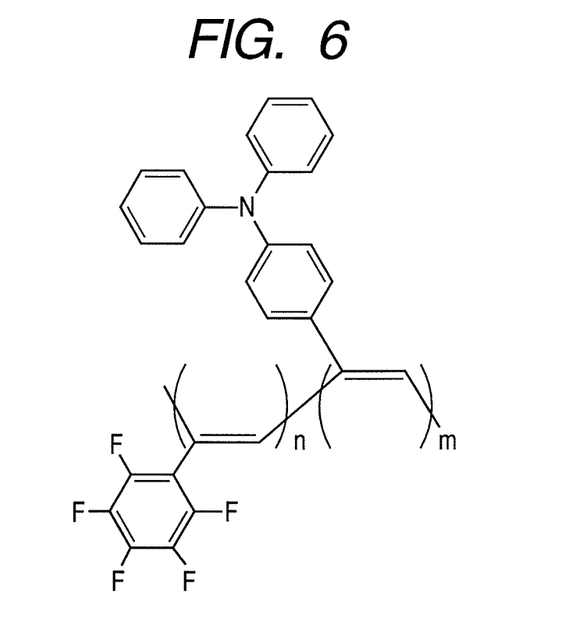
FIG. 6 illustrates the molecular structure of polyacetylene according to the embodiment of the present invention.
Figure 7:
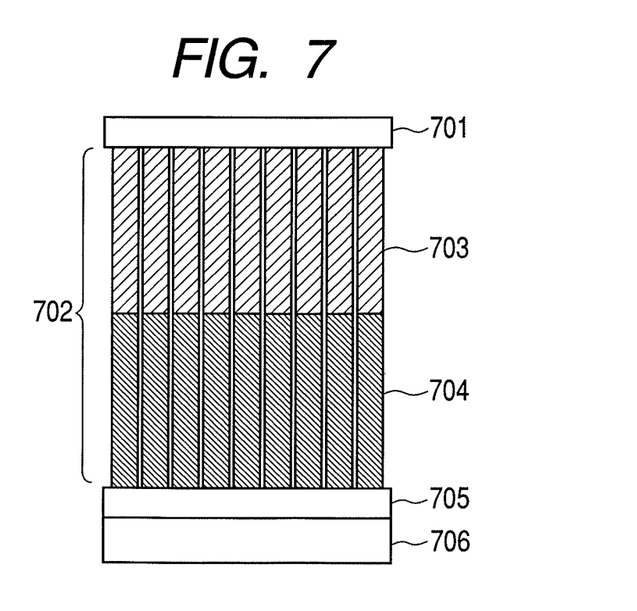
FIG. 7 illustrates a device using a polymer according to an embodiment of the present invention.

The backbone structure of a main chain is then described. FIGS. 3 and 4 illustrate cases where the structure of the main chain backbone is of the helical type. In FIG. 3, a main chain 301 is an acetylene backbone and forms a helix. An electron-transporting block 302 formed with pentafluorophenylacetylene and a hole-transporting block 303 formed with 4-diphenylaminophenylacetylene are formed on side chains of the helical acetylene backbone to provide a block polymer. FIG. 4 is a Y-Z plan view of FIG. 3. The plan views of the compound illustrated in FIGS. 3 and 4 are FIG. 5 and FIG. 6. It is inferred from FIGS. 5 and 6 that since no interface is present in the main chain backbone, the transfer of an electron or a hole is efficiently conducted. The molecular chain length is further elongated by synthesis, whereby the molecule becomes a linear rod. This rod is harder than a simple polymer but has higher flexibility than inorganic materials. Therefore, handling of the molecule becomes simple. For example, in a block polymer having an electron-transporting block and a hole-transporting block, both blocks can be sterically separated to reduce unnecessary contact of an electron-transporting portion with a hole-transporting portion compared with a random coil molecule. Therefore, it can be easily inferred that a linear molecule is excellent in light-emitting property and charge separation property compared with an ordinary polymer form. For example, in the case of a light-emitting device having a block polymer with an electron-transporting block, a luminescent block and a hole-transporting block ranging in this order, the electron-transporting block and the hole-transporting block are separated by the luminescent block therebetween, whereby recombination of an electron and a hole is inhibited, and an electron transferred in the electron-transporting block and a hole transferred in the hole-transporting block are recombined in the luminescent block to effectively emit light. An example of the construction of a light-emitting device using such a rod-like helical block polymer is illustrated in FIG. 7. A lower electrode 705 is located on a substrate 706, and a rod-like helical block polymer 702 is arranged on the lower electrode 705. In FIG. 7, a hole-transporting block 704 is arranged on the side of the lower electrode 705, and an electron-transporting block 703 is arranged on the side of an upper electrode 701. This is determined depending on the correlation with a molecule to which a thiol group is easily introduced upon preparation of a molecule on an electrode. Since the molecule is in the form of a rod, and the transporting directions of the electron and hole are regulated to the helical axis direction of the molecular chain, recombination of the electron and the hole is liable to be accelerated, and improvement in luminous efficiency can be expected.

(Additional Function)

Other addable constitutions include provision of a functional group having high insulating property (also referred to as an insulating functional group), such as an alkyl group, on a terminal of a side chain. Since the alkyl group is high in insulating property, the outside of the block polymer can be caused to function as an insulating layer by introducing the alkyl group in the terminal of the side chain. This permits the molecule itself to take such a constitution that a conductive wire is covered with an insulating vinyl resin like an electric wiring. The alkyl group may also be selectively introduced, thereby forming an insulating cover portion in a part of the molecule. For example, it is also possible that a part of a P-type or N-type block is exposed for bringing both terminals into contact with respective electrodes, and a central part is covered with an insulating cover portion. Quite naturally, only one terminal may be exposed, and it is also considered that an intermediate part of the block polymer is exposed to bring it into contact with another block polymer. An alkyl chain may be provided at a terminal of the side chain, thereby covering the outside of the molecule with the insulating cover portion to control the electron and hole so as to transfer only within the molecule. In other words, a conductive molecule with intermolecular recombination of an electron and a hole inhibited by insulating the molecule with the insulating cover portion can be provided. In addition, molecule design is easy because a range of selection of the side chain is wide, and so a possibility that a device is fabricated according to a desired plan becomes high.

(Regarding One Block in Block Polymer)

A block is formed by polymerizing the same monomer. However, plural kinds of monomers may be used so far as a block formed by polymerization exhibits electron-transporting property or hole-transporting property, as described above. At least 10 units are necessary as one block. Fifty units or more and less than 1,000 units are favorable. Since the upper limit thereof varies according to uses, the units may be suitably selected according to uses. For example, when an electron-transporting block is synthesized with plural kinds of monomers, the synthesis may be conducted by first using a monomer high in electron-transporting property and mixing a small amount of a monomer low in electron-transporting property in the middle of the synthesis. The synthesis is conducted in this manner, thereby permitting making a difference in electron-transporting property even in a block. When another block is prepared, it is also possible to select a monomer easy to be introduced taking into account the circumstances of a compound or functional group to be introduced into a side chain in said another block. For example, when a monomer having a hydrogen-bonding functional group such as a hydroxyl group or amide group is selected for a block also having a hydrogen-bonding functional group, the bonding between blocks becomes firm due to hydrogen bonding between the functional groups, so that the block is easy to be prepared.

(Regarding Functional Block)

A side chain to be introduced into a block is selected according to functions.

For example, for an electron-transporting block, it is only necessary to introduce an electron-transporting material into a side chain of the block. The electron-transporting side chain is only required to contain the structure of the electron-transporting material. A structure derived from an electron-transporting material or a substituent of a side-chain type electron-transporting polymeric material may also be used.

Specific examples thereof include the following functional groups:

Functional groups having an $sp^2$ nitrogen atom, such as pyridine derivatives, pyrimidine derivatives, pyrazine derivatives, quinoline derivatives, triazole derivatives, oxazole derivatives, oxadiazole derivatives, thiazole derivatives and thiadiazole derivatives; and functional groups containing a fluorenone derivative, anthraquinonedimethane derivative, quinodimethane derivative, diphenoquinone derivative, coumarin derivative, cyanated aromatic derivative or fluorinated aromatic derivative.

The hole-transporting side chain is only required to contain the structure of the hole-transporting material. A structure derived from a hole-transporting material or a substituent of a side-chain type hole-transporting polymeric material may also be used.

Specific examples thereof include the following functional groups:

Functional groups containing a tertiary amine such as a triphenylamine derivative, carbazole derivative, imidazole derivative or phenylenediamine derivative; and functional groups containing an oligothiophene derivative, tetrathiafulvalene derivative, porphyrin derivative, phthalocyanine derivative, stilbene derivative or fused aromatic derivative.

For a luminescent block, it is only necessary to introduce a luminescent material into a side chain. The luminescent side chain is only required to contain the structure of a fluorescent material or electroluminescent material. A structure derived from a fluorescent material or electroluminescent material or a substituent of a side-chain type polymeric luminescent material may also be used.

Specific examples thereof include the following functional groups:

Functional groups containing a carbazole derivative, fluorene derivative, quinoline derivative, coumarin derivative, triazole derivative, aromatic amine derivative, fused aromatic derivative, completely fluorinated aromatic derivative, tris(8-hydroquinoline)-aluminum complex, tris(2-phenylpyridyl) iridium complex or any other luminescent metal complex.

(Application to Electrolysis Using Block Polymer)

The block polymer composed of the electron-transporting block and the hole-transporting block, which is the block polymer according to the present invention, can be used as a light-emitting layer of a light-emitting device, as described above. However, the following application may also be considered.

When the block polymer is irradiated with light, charges are generated in electrons of the block polymer, and then the charges are gathered at both terminals of the block polymer molecule, thereby generating a potential difference between both terminals of the block polymer molecule. The thus-generated potential difference can be utilized. Since electrolysis is caused when water is brought into contact, the potential difference can be used for conducting electrolysis of water.

In addition, the wavelength of excitation light can be changed by adjusting the side chain of the block polymer molecule, and so a wide variety of light from ultraviolet light to visible light can be utilized. A contact area between a water molecule and both terminals of the polymer molecule, which correspond to electrode parts, can be greatly increased to conduct the electrolysis of water with high efficiency.

EXAMPLES

A preparation process of a substituted polyacetylene block polymer in the present invention and a fabrication process of a device structure of the substituted polyacetylene block polymer and electrodes will hereinafter be described.

Example 1

A test tube closed after subjected to pressure reduction and purging with nitrogen is charged with 30 mg ($6.5 \times 10^{-6}$ mol) of a dimer of rhodium (norbornadiene) chloride, and is evacuated under reduced pressure and purged with nitrogen after closely sealed with a septum cap. Thereafter, 100 mg ($1.19 \times 10^{-3}$ mol) of triethylamine as a promoter and 10 ml of toluene as a solvent are put therein, and the contents are stirred for 30 minutes at 30° C. A mixed solution of 1.25 g ($6.5 \times 10^{-3}$ mol) of pentafluorophenylacetylene represented by Formula 1 and 2.0 ml of toluene is poured into the thus-obtained toluene solution of the rhodium complex, thereby initiating a polymerization reaction. The reaction is conducted for 1 hour at 30° C., and a mixed solution of 1.75 g ($6.5 \times 10^{-3}$ mol) of 4-diphenylaminophenylacetylene represented by Formula 2 and 2.0 ml of toluene is poured therein after polymerization is allowed to sufficiently progress. The polymerization reaction is further conducted. The reaction is conducted for 2 hours at 30° C., and the resultant polymer is washed with a largely excess amount of methanol, separated by filtration and then vacuum-dried for 24 hours, thereby obtaining a polyacetylene block polymer [poly((pentafluorophenylacetylene)-co-(4-diphenylamino-phenylacetylene))] illustrated in FIG. 4.

Whether the intended product was obtained or not was confirmed by measuring 1H-NMR of the block polymer and homopolymers to measure signals of the phenyl group and the methine group of the main chain. The molecular weights of the block polymer and homopolymers were measured by gel permeation chromatography (GPC, solvent: THF) to confirm that two blocks are bonded to form a block polymer, since the molecular weight changed in accordance with the calculated value.

Formula 1

Formula 2

Example 2

A test tube closed after subjected to pressure reduction and purging with nitrogen is charged with 12.0 mg ($2.5 \times 10^{-5}$ mol) of a dimer of rhodium (norbornadiene) chloride and 10 ml of toluene. After the contents are stirred for 15 minutes at 0° C., a toluene solution of 0.1 mol/l of 1,1,2-triphenylvinyl-lithium is poured therein, and the resultant mixture is stirred for 10 minutes. Further, 1.6 ml of a toluene solution of 0.1 mol/l of triphenylphosphine as a promoter is poured, and the contents are stirred for 20 minutes.

A mixed solution of 1.25 g ($6.5 \times 10^{-3}$ mol) of pentafluorophenylacetylene and 2.0 ml of toluene is poured into the above-obtained toluene solution of the rhodium complex, thereby initiating a polymerization reaction. The reaction is conducted for 1 hour at 30° C., and a mixed solution of 0.175 g ($6.5 \times 10^{-3}$ mol) of 4-diphenylaminophenylacetylene and 2.0 ml of toluene is poured therein after polymerization is allowed to sufficiently progress, thereby further conducting the polymerization reaction. The reaction is conducted for 2 hours at 30° C., and the resultant polymer is washed with a largely excess amount of methanol, separated by filtration and then vacuum-dried for 24 hours, thereby obtaining the intended polyacetylene block polymer [poly((pentafluorophenylacetylene)-co-(4-diphenylaminophenylacetylene))].

Example 3

Pentafluorophenylacetylene is polymerized with 4-(N-carbazolyl)phenylacetylene represented by Formula 3 according to the same process as in Example 2, thereby obtaining the intended polyacetylene block polymer [poly((4-(N-carbazolyl)phenylacetylene)-co-(4-pentafluorophenylacetylene))].

Formula 3

Example 4

3-Ethynylquinoline represented by Formula 4 is polymerized with 3-ethynyl-7-ethylhexylcarbazole represented by Formula 5 according to the same process as in Example 2, thereby obtaining the intended polyacetylene block polymer [poly((3-ethynylquinoline)-co-(3-ethynyl-7-ethylhexylcarbazole))].

Chemical Formula 4

Formula 5

Example 5

3-Ethynylquinoline represented by Formula 4 is polymerized with 4-di(3,4-ethylenedioxyphenyl)-aminoacetylene represented by Formula 6 according to the same process as in Example 2, thereby obtaining the intended polyacetylene block polymer [poly((3-ethynylquinoline)-co-(4-di(3,4-ethylenedioxyphenyl)-aminoacetylene))].

Formula 6

As described above, various kinds of novel block polymers can be provided.

Example 6

A device in this example can be fabricated in the following manner.

After an ITO substrate is ultrasonically washed for 15 minutes in ethanol, the substrate is dried and immersed for 20 minutes in concentrated sulfuric acid. After the substrate is then washed with ultrapure water, the substrate is immersed for 15 minutes in a 1:1 solution of a 30% aqueous solution of hydrogen peroxide and a 28% aqueous solution of ammonia at 80° C., further washed with ultrapure water and dried with nitrogen gas. An ITO substrate having a hydrophilic surface is obtained in the above-described manner.

The poly((3-ethynylquinoline)-co-(4-di(3,4-ethylenedioxyphenyl)aminoacetylene)) obtained by the process in Example 5 is dissolved in chloroform to prepare a solution having a concentration of 0.5 mg/mL. This solution (500 μL) is added dropwise at a rate of 2 μL/sec to the surface of ultrapure water filled in a water vessel 801 (width: 40 cm) illustrated in FIGS. 8A and 8B and having an initial surface area of 2,700 cm$^2$ when a moving barrier 803 is located at the left end. After completion of the drop addition, the moving barrier 803 is moved in a direction of an arrow 806 to control it such that the value of a film pressure gauge 802 reaches 25 mN/m, thereby forming a developed film 805 of the helical substituted polyacetylene on the water surface.

Figure 8A:
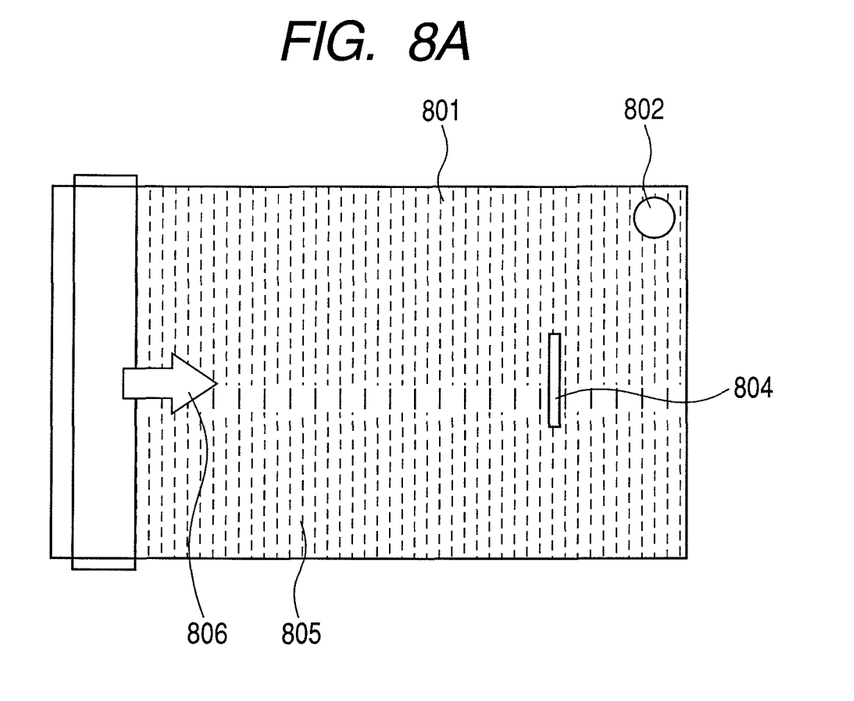
FIGS. 8A and 8B illustrate a production process of a device using a polymer.
Figure 8B:
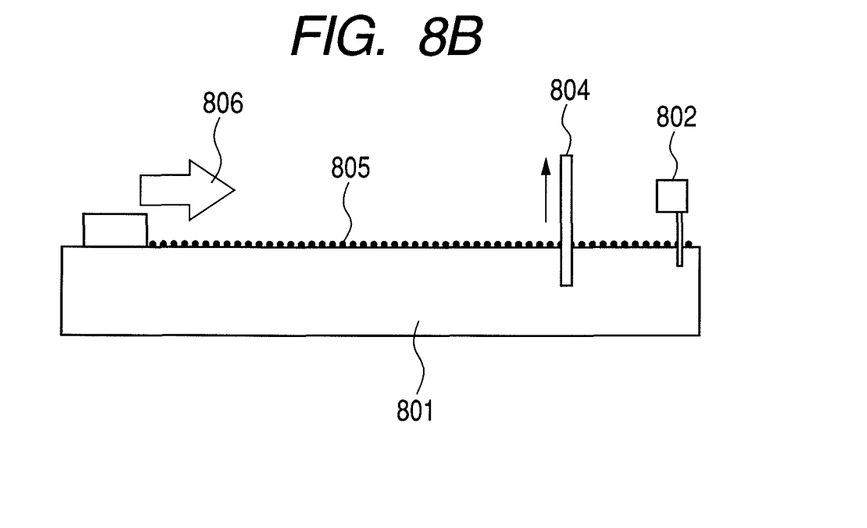

The ITO substrate 804 subjected to the hydrophilization treatment according to the process described above is placed under the developed film 805 on the water surface in the water vessel 801 in advance and is caused to rise at a rate of 0.3 mm/sec, thereby transferring the developed film 805 on the glass substrate 804 to obtain a polymer film vertically oriented on the glass substrate.

Figure 9:
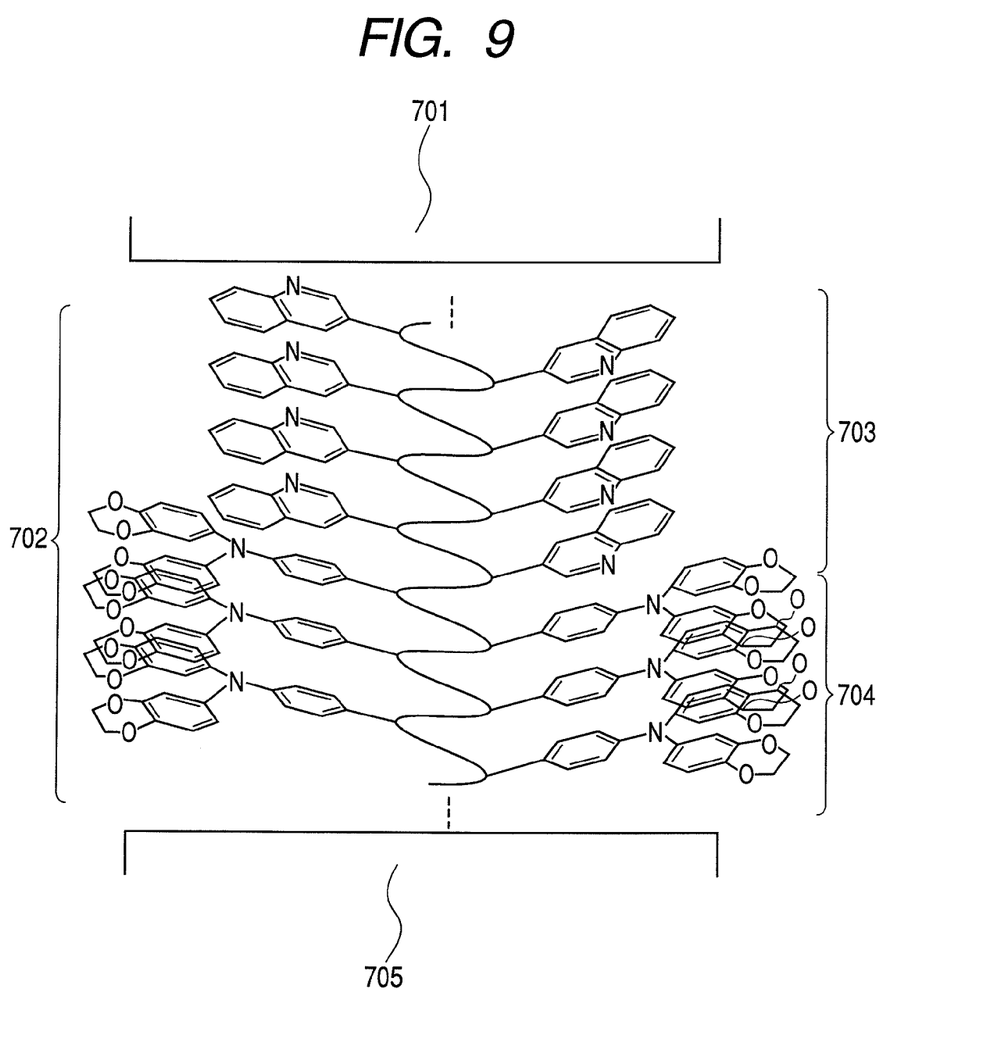
FIG. 9 illustrates a device using a polymer according to another embodiment of the present invention.

Gold is vapor-deposited on the thus-obtained polyacetylene film, whereby a device of the polyacetylene film sandwiched between two electrodes as shown in FIG. 9 can be fabricated.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2008-006930, filed Jan. 16, 2008, which is hereby incorporated by reference herein in its entirety.

The invention claimed is:

1. A block polymer having an electron-transporting block and a hole-transporting block,
   wherein the electron-transporting block and the hole-transporting block are bonded;
   wherein the main chain backbone of the block polymer is polyacetylene;
   wherein the carbon chain forming the backbone of the block polymer is in a helical form; and
   wherein a terminal of a side chain of each unit constituting the electron-transporting block and the hole-transporting block has an alkyl group.

2. The block polymer according to claim 1, wherein both the electron-transporting block and the hole-transporting block are defined as groupings of 50 units to less than 1,000 units.

3. The block polymer according to claim 1, wherein the block polymer is used for electrolysis of water.

* * * * *